United States Patent
Hayashi et al.

(10) Patent No.: US 7,807,333 B2
(45) Date of Patent: Oct. 5, 2010

(54) METHOD AND APPARATUS FOR DEVELOPMENT OF LITHOGRAPHIC PRINTING PLATE PRECURSOR

(75) Inventors: Koji Hayashi, Tatebayashi (JP); Chiaki Nakamura, Tokyo (JP); Eiji Hayakawa, Utsunomiya (JP)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/573,895

(22) PCT Filed: Aug. 23, 2005

(86) PCT No.: PCT/US2005/029799
§ 371 (c)(1),
(2), (4) Date: Feb. 19, 2007

(87) PCT Pub. No.: WO2006/026229
PCT Pub. Date: Mar. 9, 2006

(65) Prior Publication Data
US 2007/0298350 A1 Dec. 27, 2007

(30) Foreign Application Priority Data
Aug. 25, 2004 (JP) .............................. 2004-245853

(51) Int. Cl.
*G03F 7/00* (2006.01)
*G03F 7/26* (2006.01)
*G03D 13/04* (2006.01)
*B41M 5/00* (2006.01)

(52) U.S. Cl. ................. 430/302; 430/270.1; 430/273.1; 430/281.1; 430/300; 430/422; 101/463.1; 396/636

(58) Field of Classification Search ............ 430/270.1, 430/273.1, 281.1, 300, 302, 422; 101/463.1; 396/636
See application file for complete search history.

(56) References Cited

U.S. PATENT DOCUMENTS

| 3,881,998 | A | | 5/1975 | Miyosawa |
| 4,521,092 | A | * | 6/1985 | Ferrante ..................... 396/617 |
| 4,549,944 | A | * | 10/1985 | Pliefke ....................... 205/656 |
| 4,555,302 | A | | 11/1985 | Urbanik et al. |
| 4,573,782 | A | * | 3/1986 | Kobayashi et al. .......... 396/575 |
| 4,849,307 | A | * | 7/1989 | Hoffmann et al. ......... 430/271.1 |
| 4,952,958 | A | | 8/1990 | Ohba et al. |
| 5,555,234 | A | | 9/1996 | Sugimoto et al. |
| 6,284,433 | B1 | * | 9/2001 | Ichikawa et al. ............ 430/303 |
| 6,533,865 | B1 | * | 3/2003 | Phan et al. .................. 118/708 |
| 7,153,632 | B1 | * | 12/2006 | Saraiya et al. ........... 430/284.1 |

(Continued)

FOREIGN PATENT DOCUMENTS

EP 0 423 782 4/1991

(Continued)

*Primary Examiner*—Amanda C. Walke
*Assistant Examiner*—Chanceity N Robinson
(74) *Attorney, Agent, or Firm*—J. Lanny Tucker

(57) ABSTRACT

To provide a development system for lithographic printing plate precursors using a neutral developer, capable of preventing the non-image area of the resulting printing plates from being stained. In developing a lithographic printing plate precursor with a neutral developer having a pH of from 5.8 to 8.6, ultrasonic waves and/or an electric current are imparted to the neutral developer.

13 Claims, 2 Drawing Sheets

U.S. PATENT DOCUMENTS

| | | |
|---|---|---|
| 7,414,699 B2 * | 8/2008 | Belfroid et al. ............... 355/30 |
| 2002/0007751 A1 * | 1/2002 | Inoue et al. ................. 101/453 |
| 2002/0020318 A1 * | 2/2002 | Galloway et al. ........ 101/401.1 |
| 2002/0055049 A1 | 5/2002 | Watanabe |
| 2004/0146328 A1 * | 7/2004 | Sasayama ............... 400/118.2 |

FOREIGN PATENT DOCUMENTS

| | | |
|---|---|---|
| GB | 1 340 042 | 12/1973 |
| WO | WO 94/18005 | 8/1994 |

* cited by examiner

METHOD AND APPARATUS FOR DEVELOPMENT OF LITHOGRAPHIC PRINTING PLATE PRECURSOR

TECHNICAL FIELD

The present invention relates to a method and an apparatus for development of a lithographic printing plate precursor and, in particular, to a method and an apparatus for development of a lithographic printing plate precursor by the use of a neutral developer.

BACKGROUND ART

With the recent progress in computer image-processing technology, a method has been developed comprising directly drawing an image on a photosensitive layer through light irradiation corresponding to digital signals, and a computer-to-plate (CTP) system has become common and comprises applying the method to a lithographic printing plate precursor to thereby directly draw an image in a photosensitive lithographic printing plate with no output through a silver salt mask film. The CTP system of a type that uses, as the light source for light irradiation, a high-power laser having a maximum intensity in a near-infrared or infrared region has some advantages in that high-resolution images can be formed through short-time exposure to light and photosensitive lithographic printing plates for use in the system can be handled in a daylight room. In particular, high-power and small-sized, solid-state lasers and semiconductor lasers capable of radiating infrared (IR) rays having a wavelength of from 760 nm to 1200 nm have become available.

As a lithographic printing plate precursors for CTP systems, those of a type having, on a substrate, a photosensitive layer that contains a thermoplastic substance such as thermoplastic resin and a photothermal conversion substance, in which the photothermal conversion substance converts laser light to heat during exposure to IR laser whereby the thermoplastic substance is thermally fused to form an image (see Patent Reference 1) have been proposed.

Others of a type having, on a substrate, a photosensitive layer that contains an unsaturated double bond-containing polymerizing substance and a photothermal conversion substance, in which the photothermal conversion substance converts laser light to heat during exposure to IR laser whereby the polymerizing substance is crosslinked to form an image (see Patent Reference 2) have been proposed.

In the lithographic printing plate precursors of those types, the exposed area forms an image and therefore, they require development for removing the non-exposed area. Different from conventional PS plates that require development with a strong alkaline developer, they may be developed with a neutral developer.

However, when a neutral developer is used, any not a strong alkaline developer, then the non-image area of a photosensitive layer can not always be removed satisfactorily and, as the case may be, there may occur a problem in that the non-image area may remain on the surface of the substrate and ink may adhere to it to cause staining of the non-image area.

Accordingly, a development system is desired which is capable of satisfactorily removing the non-image area of a photosensitive layer even in a case where a neutral developer is used for developing a lithographic printing plate precursor.

[Patent Reference 1] JP-A 9-131850
[Patent Reference 2] JP-A 2002-79772

DISCLOSURE OF THE INVENTION

Problems that the Invention is to Solve

An object of the invention is to provide a development system for a lithographic printing plate precursor, which enables good removal of a non-image area of a photosensitive layer even in a case where a neutral developer is used for developing a lithographic printing plate precursor, and which can therefore prevent the non-image area from being stained.

Means for Solving the Problems

The object of the invention can be attained by a method for developing a lithographic printing plate precursor with a neutral developer having a pH of from 5.8 to 8.6, wherein ultrasonic waves and/or an electric current are imparted to the neutral developer.

In the invention, the method may include a pretreatment step of treating the lithographic printing plate precursor with a neutral pretreatment liquid having a pH of from 5.8 to 8.6 before the development. In this case, ultrasonic waves and/or an electric current may be imparted to both or any one of the neutral developer and the neutral pretreatment liquid. The development may be performed on-press.

The development system of the invention may be favorably attained by a development apparatus for lithographic printing plate precursors, which comprises a development tank where a neutral developer having a pH of from 5.8 to 8.6 is applied to a lithographic printing plate precursor, a development-promoting means for imparting ultrasonic waves and/or an electric current to the neutral developer, and a removing means for removing a non-image part from the lithographic printing plate precursor. Preferably, the removing means is a brush roller and/or a morton roller.

The development apparatus may further comprise a pretreatment tank of applying a neutral pretreatment liquid having a pH of from 5.8 to 8.6 to the lithographic printing plate precursor before development, and the development-promoting means may be for imparting ultrasonic waves and/or an electric current to both or any one of the neutral developer and the neutral pretreatment liquid.

The development system of the invention is favorably used for a lithographic printing plate precursor of a type for image formation through thermal fusion of a thermoplastic substance or through thermal crosslinking reaction of an unsaturated double bond-containing substance. Preferably, the image forming layer of the lithographic printing plate precursor of the type for image formation through thermal crosslinking reaction of the unsaturated double bond-containing substance therein further contains a graft polymer that has a poly(alkyleneoxide) unit in the side branch thereof.

EFFECT OF THE INVENTION

The invention provides a lithographic printing plate precursor that may be directly processed through exposure to light based on digital signals with no problem of staining in the non-image area of the plate even though a neutral developer is used.

BEST MODE FOR CARRYING OUT THE INVENTION

The development system of processing a lithographic printing plate precursor of the invention comprises developing a lithographic printing plate precursor with a neutral developer and is essentially characterized in that ultrasonic waves and/or an electric current are imparted to the developer, and/or the lithographic printing plate precursor is, before the development thereof, pretreated with a neutral pretreatment liquid to which ultrasonic waves and/or an electric current are imparted. The development system of the invention is described in detail herein under.

<Developer>

The developer for use in the invention is neutral, having a pH of from 5.8 to 8.6. Using it, the non-image part of the image-forming layer (photosensitive layer) of a lithographic printing plate precursor is removed. As the developer used has a pH falling within the above range, a complicated pH-controlling step of waste treatment may be simplified or omitted. The pH value of the developer is preferably from 6.0 to 8.0 in view of the influence thereof on the external environment, more preferably from 6.5 to 7.5, even more preferably from 6.8 to 7.2, still more preferably from 6.9 to 7.1.

The medium of the developer is preferably an aqueous medium, for which, for example, water is usable, as well as a mixture of water and an organic solvent. The organic solvent includes, for example, methyl alcohol, ethyl alcohol, propyl alcohol, 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine. The content of the organic solvent is preferably from 0.1 to 5% by mass of the total mass of the developer. The aqueous medium is especially preferably water, and ordinary tap water or industrial water is favorably used.

The developer may contain a surfactant. The surfactant may be any of anionic, cationic, nonionic and ampholytic surfactants, but is preferably a nonionic surfactant. The type of the nonionic surfactant for use herein is not specifically defined, and any conventional known one may be used. For example, it includes polyoxyalkylene-modified silicones, polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol mono-fatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-castor oils, polyoxyethylene glycerin fatty acid partial esters, fatty acid diethanolamides, N,N-bis-2-hydroxyalkylamines, polyoxyethylene alkylamines, triethanolamine fatty acid esters, trialkylamine oxides.

The amount of the surfactant to be added to the developer is preferably from 0.001 to 5% by mass of the developer, more preferably from 0.01 to 3% by mass, even more preferably from 0.1 to 3% by mass. The weight-average molecular weight of the surfactant is preferably from 300 to 50,000, more preferably from 500 to 5,000. One or more of these surfactants may be used herein either singly or as combined.

If desired, any other component, for example, a reducing agent such as hydroquinone, resorcinol, sodium or potassium salt of inorganic acid e.g., sulfite or hydrogensulfite, a development stabilizer, an organic carboxylic acid, a antifoaming agent, a water softener, an organic solvent, a chelating agent, as well as any known preservative, colorant, tackifier or antifoaming agent may be added to the developer for use in the invention.

For developing the printing plate precursor, herein usable is any of rinsing liquid, finishing liquid, plate protective liquid (gum liquid) and dampening water generally used in printing plate formation or in printing.

When an electric current is imparted to the developer, it is especially desirable that a small amount of an electrolyte is added to the developer for increasing the electroconductivity thereof. Though not specifically defined, the amount of the electrolyte is typically from 0.01 to 5.0% by mass of the developer, preferably from 0.05 to 5.0% by mass, more preferably from 1.0 to 5.0% by mass, even more preferably from 2.0 to 5.0% by mass.

The electrolyte is preferably a water-soluble neutral salt, for which various types of inorganic neutral salts and organic neutral salts are usable. The inorganic neutral salts are, for example, known mineral acid salts with sodium or potassium, such as sodium chloride, potassium chloride, sodium sulfate, potassium sulfate, sodium nitrate, potassium nitrate. The organic neutral salts are, for example, sodium gluconate, sodium sorbate, potassium sorbate, sodium acetate, sodium fumarate, sodium citrate, potassium citrate, sodium succinate, potassium succinate, sodium DL-malate. Especially preferably, the electrolyte is sodium chloride and/or potassium chloride.

The temperature of the developer is preferably from 5 to 90° C., more preferably from 10 to 50° C. The time for which the lithographic printing plate precursor is processed with the developer is preferably from 1 second to 5 minutes.

<Ultrasonic Waves>

In the development system of the invention, ultrasonic waves are imparted to the developer and/or to the pretreatment liquid described below. Accordingly, the development is promoted and the staining in the non-image area may be, thereby, prevented or reduced. The frequency of the ultrasonic waves varies, depending on the type of the developer used, but is preferably from 10 to 100 kHz, more preferably from 20 to 40 kHz. The output of the ultrasonic waves also varies, depending on the amount of the developer used, but is preferably from 10 to 400 W, more preferably from 20 to 100 W.

<Electric Current>

In the development system of the invention, an electric current is imparted to the developer and/or to the pretreatment liquid described below. Accordingly, as in the case where ultrasonic waves are used, the development is promoted and the staining in the non-image area may be thereby prevented or reduced. The electric current is preferably a direct current, and though depending on the type and the amount of the developer used, the voltage and the current may be, for example, from 1 to 100 V, preferably from 10 to 50 V, and from 0.1 to 10 A, preferably from 1.0 to 5 A.

Any of ultrasonic waves or an electric current may be imparted to the developer, and both of them may be simultaneously imparted thereto. If desired, ultrasonic waves and an electric current may be alternately imparted to the developer. Ultrasonic waves and/or an electric current may be continuously imparted to the developer, or may be intermittently imparted thereto. In case where ultrasonic waves and/or an electric current are applied to the pretreatment liquid mentioned below, then ultrasonic waves and/or an electric current may not be imparted to the developer.

<Pretreatment>

In the invention, pretreatment may be optionally effected before the development. The pretreatment liquid to be used in the pretreatment in the invention is neutral, having a pH of from 5.8 to 8.6, as is the developer. As the pretreatment liquid for use herein has a pH falling within the range, a complicated pH-controlling step of waste treatment may be simplified or omitted and the used pretreatment liquid may be discharged out in the external environment. Like the developer, the pH value of the pretreatment liquid is preferably from 6.0 to 8.0, more preferably from 6.5 to 7.5, even more preferably from 6.8 to 7.2, still more preferably from 6.9 to 7.1.

The pretreatment is especially preferably carried out when an overcoat layer is formed on the surface of the lithographic printing plate precursor to be processed herein. Owing to the action of the pretreatment liquid thereon, the overcoat layer may be washed and removed. Accordingly, the non-image part of the image-forming layer of the lithographic printing plate precursor may be more sufficiently removed.

Water is preferably used for the pretreatment liquid. Water may be ordinary tap water or industrial water. Like the developer, the pretreatment liquid may contain any of an organic solvent medium, surfactant, an electrolyte, a reducing agent, a development stabilizer, organic carboxylic acid, an antifoaming agent, water softener, organic solvent, chelating agent, preservative, colorant, and a tackifier. The temperature of the pretreatment liquid is preferably from 5 to 90° C., more preferably from 10 to 50° C. The time for which the lithographic printing plate precursor is processed with the pretreatment liquid is preferably from 1 second to 5 minutes.

One preferred embodiment of pretreatment in the invention comprises applying water to the surface of the overcoat layer of a lithographic printing plate precursor through a spray pipe to thereby swell the overcoat layer with water, followed by brushing it with a brush roller or the like to thereby remove the overcoat layer. In the pretreatment, the lithographic printing plate precursor may be heated to thereby promote the removal of the overcoat layer.

In the pretreatment, ultrasonic waves and/or an electric current may be imparted to both the pretreatment liquid and the developer, or ultrasonic waves and/or an electric current may be imparted to any of the pretreatment liquid or the developer alone. Further, ultrasonic waves may be imparted to the pretreatment liquid while, on the other hand, an electric current may be imparted to the developer. An electric current may be imparted to the pretreatment liquid while, on the other hand, ultrasonic waves may be imparted to the developer.

<Apparatus for Development>

The apparatus for development of the invention comprises a development tank where a neutral developer having a pH of from 5.8 to 8.6 is applied to a lithographic printing plate precursor, a development-promoting means for imparting ultrasonic waves and/or an electric current to the neutral developer, and a removing means for removing a non-image part from the lithographic printing plate precursor. In the invention, the lithographic printing plate precursor is kept in contact with a developer in the development tank and undergoes development to remove the non-image part thereof.

(Development Tank)

The development tank of the development apparatus of the invention may be any known one, for example, including a type in which a developer is kept therein and a lithographic printing plate precursor is dipped in the developer; and a type in which a developer is sprayed onto a lithographic printing plate precursor. In particular, for preventing or reducing the developer deterioration with time, the development tank is preferably such that a floating lid may be disposed on the surface of the developer therein.

Further, it is desirable that the development tank is equipped with a stirrer unit for stirring the developer therein. The stirring unit is, for example, a propeller. The stirring unit of the type may be disposed at the bottom of the development tank, and is fitted in a U-shaped pipe of which the two ends communicate with the space inside the development tank. In this case, the developer is sucked into one end of the U-shaped pipe and is discharged out from the other end thereof, and this is thereby circulated inside the development tank. Accordingly, the developer is stirred and its development characteristics may be kept uniform. Also preferably, a filter unit is fitted to the development tank, which is for removing the non-image part released from the lithographic printing plate precursor. For example, the filter unit may be favorably fitted in the above U-shaped pipe.

Also preferably, the development tank is provided with the following mechanisms:

(1) A mechanism of automatically replenishing a necessary amount of a developer (stock) to the development tank;
(2) A mechanism of discharging a developer that is over a predetermined amount thereof;
(3) A mechanism of automatically replenishing a necessary amount of water to the development tank;
(4) A mechanism of detecting the lithographic printing plate precursor being processed therein;
(5) A mechanism of estimating the area for development based on the detected lithographic printing plate precursor;
(6) A mechanism of controlling the amount of the replenisher developer (stock) and/or water, and/or the replenishment timing, based on the data of the detected lithographic printing plate precursor and/or the estimated area for development;
(7) A mechanism of controlling the temperature of the developer;
(8) A mechanism of detecting and controlling the pH and the electroconductivity of the developer;
(9) A mechanism of controlling the amount of the replenisher developer (stock) and/or water, and/or the replenishment timing, based on the data of the pH and/or the electroconductivity of the developer.

(Development-Promoting Means)

Not specifically defined, the development-promoting means for use herein may be any known ultrasonic oscillator such as Branson's Sonifier 450D and/or any known electrification device such as Metric's Model 5222B.

The position where the ultrasonic oscillator is disposed is not specifically defined so far as it may impart ultrasonic waves to the developer and/or to the pretreatment liquid described below. For example, it may be disposed at the bottom of the development tank and/or the pretreatment tank described below.

The position where the electrode of the electrification device is disposed is not also specifically defined so far as it may impart an electric current to the developer and/or to the pretreatment liquid described below. For example, one electrode may be disposed in the development tank and/or the pretreatment tank described below or may be fitted to the floating lid of the tank, and the other may be kept in contact with the substrate of the lithographic printing plate precursor being processed. In particular, it is desirable that the cathode is kept in contact with the substrate of the lithographic printing plate precursor. In place of keeping the electrode in direct contact with the substrate of the lithographic printing plate precursor, the electrode may be disposed in the vicinity of the substrate. The electrode may be connected to the removing means described below.

(Removing Means)

The removing means for removing the non-image part of the lithographic printing plate precursor is not specifically defined, and, for example, any known removing means such as a brush roller, a morton roller, or a developer-jetting nozzle. Preferred is a brush roller or a morton roller is usable.

(Pretreatment Tank)

Preferably, the development apparatus of the invention comprises a pretreatment tank for applying a neutral medium having a pH of from 5.8 to 8.6 to the lithographic printing plate precursor before development. For the pretreatment tank, usable is any known one of, for example, a type of keeping a pretreatment liquid therein so that the lithographic printing plate precursor being processed could be dipped in the pretreatment liquid therein, or a type capable of spraying a pretreatment liquid onto the lithographic printing plate precursor.

Like the development tank, the pretreatment tank preferably has a stirring means for stirring the pretreatment liquid therein. The stirring means is, for example, a propeller. The stirring means of the type may be disposed at the bottom of the pretreatment tank, and is fitted in a U-shaped pipe of which the two ends communicate with the space inside the pretreatment tank. In this case, the pretreatment liquid is sucked into one end of the U-shaped pipe and is discharged out from the other end thereof, and this is thereby circulated inside the pretreatment tank. Accordingly, the pretreatment liquid is stirred and its treatment characteristics may be kept uniform. Also preferably, a filter means is fitted to the pretreatment tank, which is for removing the overcoat layer peeled from the lithographic printing plate precursor. For example, the filter means may be favorably fitted in the above U-shaped pipe.

Like the development tank, the pretreatment tank is provided with the following mechanisms:

(1) A mechanism of automatically replenishing a necessary amount of a pretreatment liquid to the pretreatment tank;
(2) A mechanism of discharging a pretreatment liquid that is over a predetermined amount thereof;
(3) A mechanism of automatically replenishing a necessary amount of water to the pretreatment tank;
(4) A mechanism of controlling the temperature of the pretreatment liquid;
(5) A mechanism of detecting and controlling the pH and/or the electroconductivity of the pretreatment liquid;
(6) A mechanism of removing the overcoat layer of the lithographic printing plate precursor, such as a brush roller.

Like the development tank, the pretreatment tank, if any, in the development apparatus of the invention may be provided with a development-promoting means fitted thereto. When the pretreatment tank has a development-promoting means fitted thereto, then the development tank may not have a development-promoting means fitted thereto.

The development apparatus of the invention may comprise, in addition to the pretreatment tank for pretreatment before development and the development tank for development, a post-washing tank for washing the printing plate with water (running water or circulating water), a rinsing tank for rinsing it, and a desensitization tank for desensitizing it. The apparatus may also comprise a post-treatment tank having the functions of these additional tanks.

In the invention, a lithographic printing plate precursor exposed to light may be directly set in a printer, in which damping water may be applied to the lithographic printing plate precursor so that the plate precursor could be developed with the dampening water. In this case, a development-promoting means (ultrasonic generator and/or electrification device) is disposed on the printer so that it may impart ultrasonic waves and/or an electric current to the dampening water.

In this case, the ultrasonic generator may be disposed in a water boat (dampening water pan) of the printer, or the anode of the electrification device may be disposed in the water boat, or any of watering rollers for applying water from the water boat to the printing plate precursor may be used as the anode of the electrification device.

<Lithographic Printing Plate Precursor>

The development system of the invention is usable for development of any lithographic printing plate precursor that is developable with a neutral developer, preferably water. In particular, it is favorable for development of a lithographic printing plate precursor of a type for image formation through thermal fusion of thermoplastic particles or through thermal crosslinking reaction of an unsaturated double bond-containing substance.

The lithographic printing plate precursor of a type for image formation through thermal fusion of thermoplastic particles may have, for example, an image-forming layer that contains thermoplastic polymer particles. In this type, hydrophobic thermal-fusing resin particles are dispersed in a hydrophilic polymer matrix, and owing to the heat generated in exposure to light, the hydrophobic polymer particles fuse together to form a hydrophobic polymer region, or that is, an image region. Preferably, the hydrophobic thermal-fusing resin particles (hereinafter referred to as "polymer particles") may thermally fuse together to form a fused structure. More preferably, their surface is hydrophilic and they can disperse in a hydrophilic component such as dampening water.

Preferred examples of the polymer particles are thermoplastic polymer particles described in Research Disclosure No. 33303 (January 1992), JP-A 9-123387, 9-131850, 9-171249, 9-171250, EP-A 931,647. Concretely, they are particles of a homopolymer, a copolymer or their mixture of a monomer such as ethylene, styrene, vinyl chloride, methyl acrylate, ethyl acrylate, methyl methacrylate, ethyl methacrylate, vinylidene chloride, acrylonitrile, vinylcarbazole. In particular, preferably used are polystyrene and polymethyl methacrylate.

Polymer particles having a hydrophilic surface include those that are hydrophilic by themselves, such as those of a polymer hydrophilic by itself, or those of a polymer that has a hydrophilic group such as a sulfonic acid group or a carboxylic acid group introduced into the main chain or the side branch thereof and is therefore hydrophilicated by the group; and those that have a hydrophilic polymer such as polyvinyl alcohol or polyethylene glycol, or a hydrophilic oligomer or a hydrophilic low-molecular compound adsorbed by the surface of the polymer particles and are therefore hydrophilicated on their surface. More preferably, the polymer particles have a reactive functional group. The polymer particles of those types are preferably dispersed in a hydrophilic polymer matrix, and for on-press development, they may have better on-press developability and, in addition, the film strength of the image-forming layer formed of them may increase.

A photothermal conversion substance is added to the image-forming layer. The photothermal conversion substance is preferably a substance capable of absorbing IR light having a wavelength of from 700 nm to 1200 nm, more preferably pigment or dye having such an absorption band. Concretely, the dye includes azo dyes, metal complex salt-type azo dyes, pyrazolonazo dyes, naphthoquinone dyes, anthraquinone dyes, phthalocyanine dyes, carbonium dyes, quinonimine dyes, methine dyes, cyanine dyes, squarylium dyes, pyrylium dyes, metal thiolate complexes (e.g., nickel-thiolate complex). Of those, cyanine dyes are preferred, such as cyanine dyes of formula (I) in JP-A 2001-305722, and compounds described in [0096] to [0103] in JP-A 2002-079772. Preferably, the composition of a type for image formation through thermal fusion of thermoplastic particles contains compounds such as sensitivity-controlling agent, printing-out agent and dye, and surfactant for improving the coatability of the layer, added thereto. Precisely, compounds described in [0053] to [0059] in JP-A 2001-305722 are preferred.

The photothermal conversion substance is especially preferably a dye of the following formula:

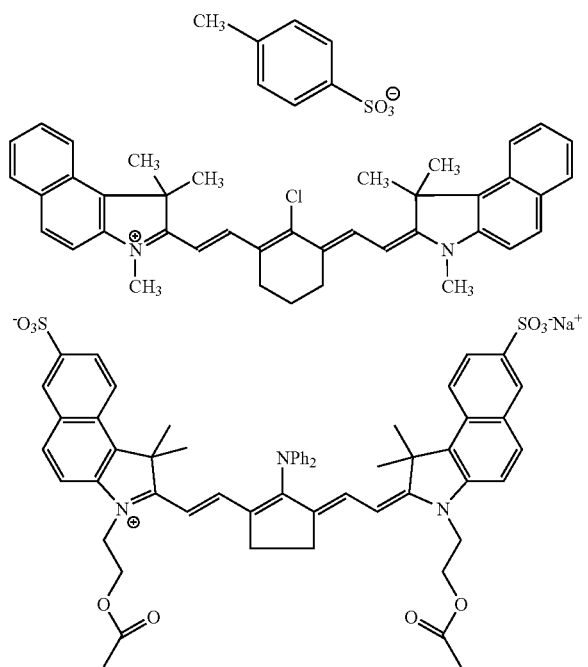

The photothermal conversion substance may be added to the image-forming layer in an amount of from 0.01 to 50% by mass, preferably from 0.1 to 20% by mass, more preferably from 1 to 10% by mass of the layer. If the amount is smaller than 0.01% by mass, then the sensitivity of the layer may be low; but if it is larger than 50% by mass, then the non-image area may be stained during printing. One or more such photothermal conversion substances may be used herein either singly or as combined.

The type for image formation through thermal crosslinking reaction of an unsaturated double bond-containing substance is, for example, a lithographic printing plate precursor having an image-forming layer that contains a photothermal conversion substance such as that mentioned above, a radical generator, and a radical-polymerizing compound having at least one ethylenic unsaturated double bond, and optionally a binder.

The radical generator generates a radical owing to the heat generated by the photothermal conversion substance in exposure to light. The radical generator includes, for example, onium salts, trihalomethyl group-containing triazine compounds, peroxides, azo-type polymerization initiators, azide compounds, quinonediazides. Preferred are onium salts as having a high sensitivity. Preferred examples of onium salts are iodonium salts, diazonium salts and sulfonium salts. These onium salts function not as an acid generator but as a radical polymerization initiator.

Examples of the onium salts preferably used in the invention are onium salts of the following general formula (III) ([OI-1] to [OI-10]), onium salts of the following general formula (IV) ([ON-1] to [ON-5]), and onium salts of the following general formula (V) ([OS-1] to [OS-5]).

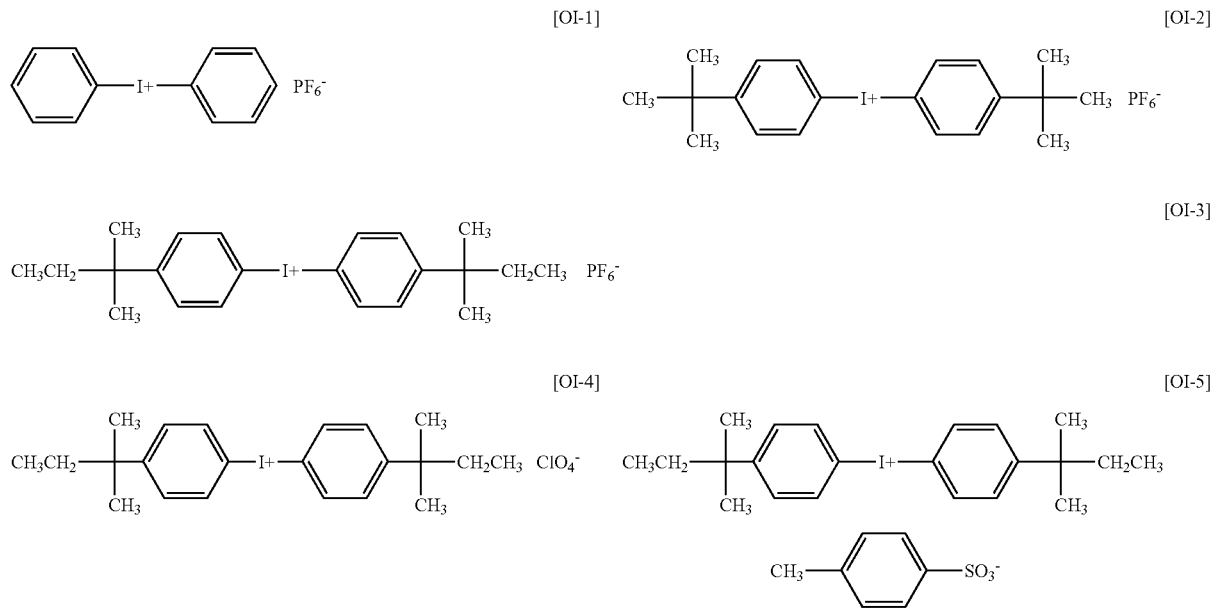

-continued
[OI-6]
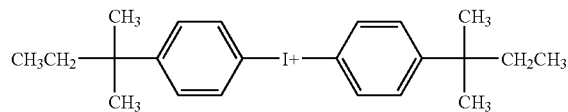
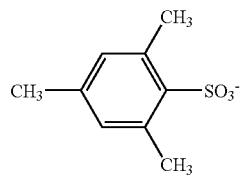
[OI-7]
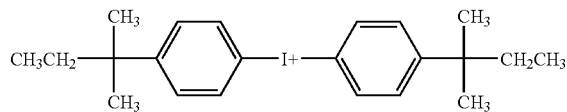
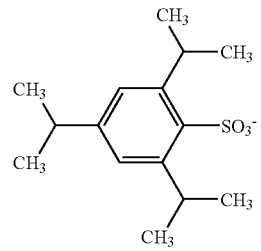
[OI-8]
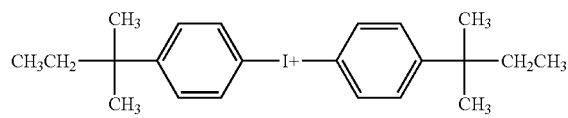
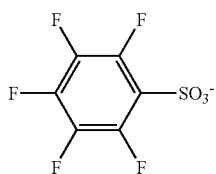
[OI-9]
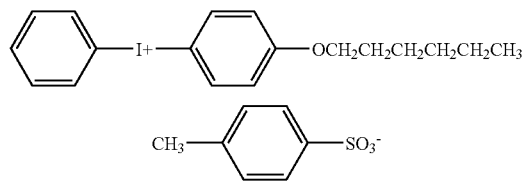
[OI-10]
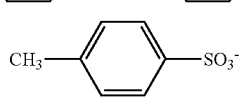
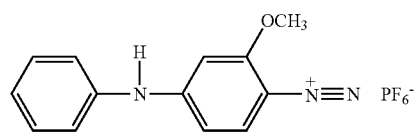
[ON-1]
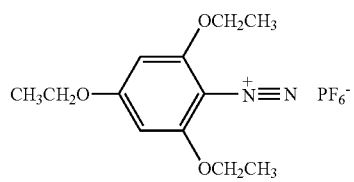
[ON-2]
[ON-3]
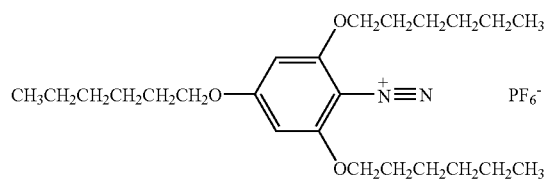
[ON-4]
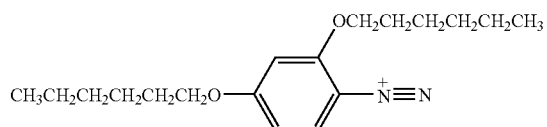

-continued

[ON-5]
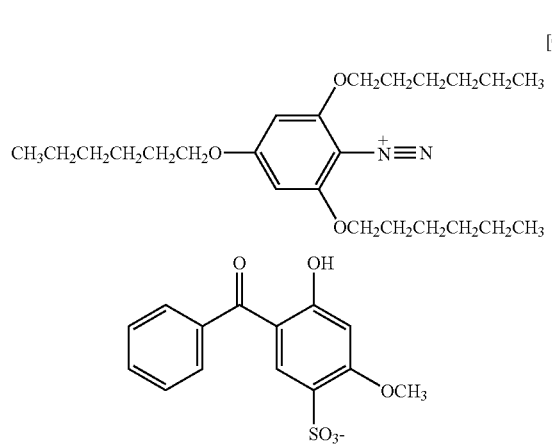

[OS-1]
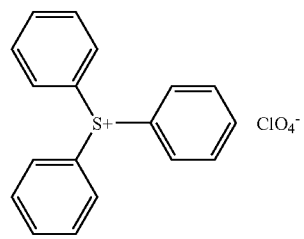

[OS-2]
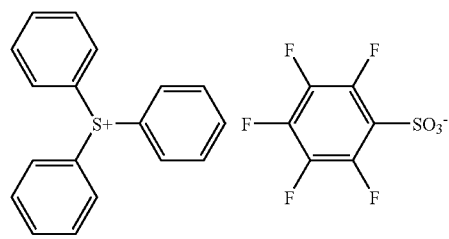

[OS-3]
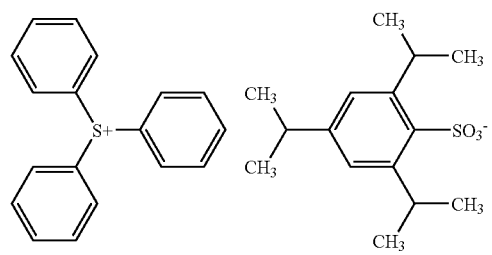

[OS-4]
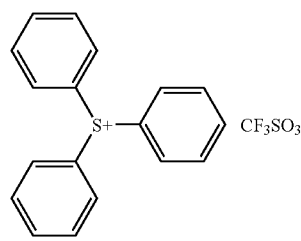

[OS-5]
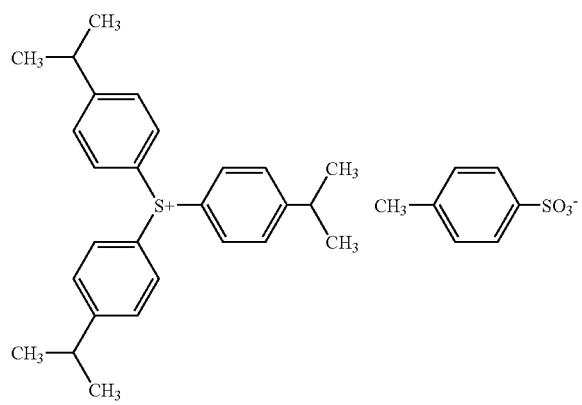

For the onium salts functioning as a radical generator, especially preferred are diphenyliodonium derivatives, and more preferred is 4-methoxyphenyl[4-(2-methylpropyl)phenyl]iodonium) hexafluorophosphate.

The onium salts for use in the invention preferably have a maximum absorption wavelength of at most 400 nm, more preferably at most 360 nm. By having an absorption wavelength in the UV range, the lithographic printing plate precursor may be processed under ordinary light.

The onium salt may added to the image-forming layer in an amount of from 0.1 to 50% by mass, preferably from 0.5 to 30% by mass, more preferably from 1 to 20% by mass of the layer. If the amount is smaller than 0.1% by mass, then the sensitivity of the layer may be low; but if larger than 50% by mass, the non-image area may be stained during printing. One or more such onium salts may be used herein either singly or as combined.

The radical-polymerizing compound having at least one ethylenic unsaturated double bond is preferably selected from compound having at least one, preferably two or more terminal ethylenic unsaturated bonds. The radical-polymerizing compound of the type is known in the art, and any one may be selected and used in the invention with no specific limitation.

For example, the compound may be used in the form of monomer, oligomer, polymer or their mixture.

Examples of monomer or oligomer are unsaturated carboxylic acids (e.g., acrylic acid, methacrylic acid, itaconic acid, crotonic acid, isocrotonic acid, maleic acid) and their esters and amides. Preferred are esters of unsaturated carboxylic acid with aliphatic polyalcohol compound; and amides of unsaturated carboxylic acid with aliphatic polyamine compound.

Also preferred for use herein are addition reaction products of unsaturated carboxylates or amides having a nucleophilic substituent such as a hydroxyl group, an amino group or a mercapto group, with monofunctional or polyfunctional isocyanates or epoxides; and dehydrating condensation products thereof with monofunctional or polyfunctional carboxylic acids.

Also preferred are addition reaction products of unsaturated carboxylates or amides having an electrophilic substituent such as an isocyanate group or an epoxy group, with monofunctional or polyfunctional alcohols, amines or thiols; and substitution reaction products of unsaturated carboxylates or amides having a leaving substituent such as a halide group or a tosyloxy group, with monofunctional or polyfunctional alcohols, amines or thiols. In place of the unsaturated carboxylic acids, usable are compound groups substituted with unsaturated phosphonic acid or styrene.

Examples of the radical-polymerizing compounds, esters of aliphatic polyalcohol compound with unsaturated carboxylic acid, are acrylates such as ethylene glycol diacrylate, triethylene glycol diacrylate, polyethylene glycol methyl ether acrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer.

Methacrylates for the above examples include tetramethylene glycol dimethacrylate, triethylene glycol dimethacrylate, polyethylene glycol methyl ether methacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol pentamethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

Itaconates include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Crotonates include ethylene glycol dicrotonate, tetramethylene glycol dicrotonate, pentaerythritol dicrotonate, and sorbitol tetradicrotonate.

Isocrotonates include ethylene glycol diisocrotonate, pentaerythritol diisocrotonate, and sorbitol tetraisocrotonate.

Maleates include ethylene glycol dimaleate, triethylene glycol dimaleate, pentaerythritol dimaleate, and sorbitol tetramaleate.

Preferred examples of other esters are aliphatic alcohol esters as in JP-B 46-27926, 51-47334, and JP-A 57-196231; aromatic skeleton-having esters as in JP-A 59-5240, 59-5241, 2-226149; and amino group-containing esters as in JP-A 1-165613.

Examples of the radical-polymerizing compounds, amides of aliphatic polyamine compound with unsaturated carboxylic acid, are methylenebis-acrylamide, methylenebis-methacrylamide, 1,6-hexamethylenebis-acrylamide, 1,6-hexamethylenebis-methacrylamide, diethylenetriamine-trisacrylamide, xylylene-bisacrylamide, and xylylene-bismethacrylamide. Examples of other preferred amide monomers usable herein are those having a cyclohexylene structure as in JP-B 54-21726.

Also preferred for use herein are urethane-type addition-polymerizing compounds produced through addition reaction of isocyanate and hydroxyl group, and their examples are vinylurethane compounds having two or more polymerizing vinyl groups in one molecule that are produced through addition of a hydroxyl group-containing vinyl monomer of a formula, $CH_2=C(R^1)COOCH_2CH(R^2)OH$ (where $R^1$ and $R^2$ each independently represent H or $CH_3$) to a polyisocyanate compound having two or more isocyanate groups in one molecule as in JP-B 48-41708.

Also preferred are urethane acrylates as in JP-A 51-37193, JP-B 2-32293, 2-16765 and ethyleneoxide skeleton-having urethane compounds as in JP-B 58-49860, 56-17654, 62-39417, 62-39418.

Also usable herein are radical-polymerizing compound having an amino structure or a sulfido structure in the molecule as in JP-A 63-277635, 63-260909, and 1-105238. Further mentioned are specific unsaturated compounds described in JP-B 46-43946, 1-40337, and 1-40336; and vinylphosphonic acid compounds described as in JP-A 2-25493. As the case may be, favorably used are perfluoroalkyl group-containing compounds as in JP-A 61-22048. In addition, usable are those introduced as photocurable monomers and oligomers in the Journal of Adhesive Society of Japan, Vol. 20, No. 7, pp. 300-308 (1984).

As the polymer-type radical-polymerizing compound having at least one ethylenic unsaturated double bond, further mentioned in addition to the polymers of the above monomers or oligomers are polyfunctional acrylates and methacrylates, such as polyester acrylates as in JP-A 48-64183, JP-B 49-43191, 52-30490, and epoxyacrylates produced through reaction of epoxy resin and (meth)acrylic acid.

As other preferred examples of the polymer-type radical-polymerizing compound having at least one ethylenic unsaturated double bond, still further mentioned are methacrylic acid copolymers, acrylic acid copolymers, itaconic acid copolymers, crotonic acid copolymers, maleic acid copolymers and partial-esterified maleic acid copolymers having an allyl group and/or a (meth)acryloyl group in the side branch thereof.

The above-mentioned polymers may be any of random polymers, block polymers or graft polymers, but preferably random or graft polymers. Especially preferred are copolymers of allyl acrylate or allyl methacrylate and styrene.

The above-mentioned polymers may be produced by any known method. The solvent usable in producing them includes, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. One or more these solvents may be used either singly or as combined. As the radical polymerization initiator for polymer production, usable are any known compounds such as azo-type initiators, peroxide initiators.

As the polymer-type radical-polymerizing compound having at least one ethylenic unsaturated double bond, especially preferred are copolymers of polyethylene glycol methyl ether methacrylate with at least one or more selected from a group consisting of styrene, acrylonitrile, allyl acrylate and allyl methacrylate; or addition polymers of a polyisocyanate compound with at least one or more selected from a group consisting of hydroxyethyl acrylate, hydroxyethyl methacrylate, pentaerythritol diacrylate, pentaerythritol triacrylate and pentaerythritol tetraacrylate.

The above radical-polymerizing compound may be added to the image-forming layer in an amount of from 5 to 80% by mass, preferably from 10 to 70% by mass, more preferably from 15 to 60% by mass of the layer. If the amount is smaller than 5% by mass, then, the compound will cure poorly; but if larger than 80% by mass, then the image-forming layer may be sticky. One or more of these radical-polymerizing compounds may be used herein either singly or as combined.

The binder includes, for example, copolymers having a hydrophilic segment, and cellulose derivatives such as hydroxyethyl cellulose and hydroxypropyl cellulose. Preferred are graft copolymers having a poly(alkyleneoxide) unit in the side branch thereof. More preferred are homopolymers of polyethylene glycol monomethacrylate, polyethylene glycol methyl ether methacrylate, polyethylene glycol ethyl ether methacrylate, polyethylene glycol butyl ether methacrylate, polyethylene glycol monoacrylate, polyethylene glycol methyl ether acrylate, polyethylene glycol ethyl ether acrylate, polyethylene glycol butyl ether acrylate, polypropylene glycol monomethacrylate, polypropylene glycol methyl ether methacrylate, polypropylene glycol ethyl ether methacrylate, polypropylene glycol butyl ether methacrylate, polypropylene glycol monoacrylate, polypropylene glycol methyl ether acrylate, polypropylene glycol ethyl ether acrylate, polypropylene glycol butyl ether acrylate, polyethylene-co-glycol propylene glycol monomethacrylate, polyethylene-co-propylene glycol methyl ether methacrylate, polyethylene-co-propylene glycol ethyl ether methacrylate, polyethylene-co-propylene glycol butyl ether methacrylate, polyethylene-co-propylene glycol monoacrylate, polyethylene-co-propylene glycol methyl ether acrylate, polyethylene-co-propylene glycol ethyl ether acrylate, polyethylene-co-propylene glycol butyl ether acrylate, and copolymers thereof with any other monomer.

The weight-average molecular weight of the binder is preferably at least 5000, more preferably from 10,000 to 300,000; and the number-average molecular weight thereof is preferably at least 1000, more preferably from 2000 to 250,000. The degree or polydispersiveness (weight-average molecular weight/number-average molecular weight) of the binder is preferably at least 1, more preferably from 1.1 to 10.

One or more of the binders may be used in the invention either singly or as combined. The binder may be added to the image-forming layer in an amount of from 20 to 95% by mass, preferably from 30 to 90% by mass of the layer. If the amount is smaller than 20% by mass, then the strength of the image part of the layer may be unsatisfactory; but if larger than 95% by mass, then an image could not be formed in the layer. Preferably, the blend ratio of the above radical-polymerizing compound to the binder is from 1/9 to 7/3 by weight.

Optionally but preferably, the image-forming layer may contain compounds such as printing-out agent, thermal polymerization inhibitor, higher fatty acid derivative and plasticizer, and surfactant for bettering the coatability of the layer, added thereto. More precisely, the compounds described in [0110] to [0113] in JP-A 2002-079772 are preferred.

The lithographic printing plate precursor may be fabricated by forming, on a substrate, a solution that contains the components of the image-forming layer.

The solvent usable herein includes water, as well as organic solvents such as ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulforane, γ-butyrolactone and toluene; and mixtures of water and any of such organic solvents. One or more such solvents may be used herein either singly or as combined. The concentration of the image-forming layer components (all solid contents including additives) in the solvent is preferably from 1 to 50% by mass.

Though varying depending on the use thereof, the amount (solid content) of the solution to be applied to a substrate is, in general, preferably from 0.5 to 5.0 g/m$^2$ for a lithographic printing plate precursor. With a reduction in the coating amount, the apparent density may increase, but the film properties of the image-forming layer worsen. The solution applied onto a substrate may be dried generally at room temperature, but for shortening the drying time, it may be dried in a hot air drier or an IR drier at 30 to 150° C. for 10 seconds to 10 minutes.

Various coating methods may be employed herein for forming the coating layer. For example, herein employable are methods of roll coating, dipping, air knife coating, gravure coating, gravure offset coating, hopper coating, blade coating, wire doctor coating or spraying.

In addition to the above-mentioned image-forming layer, any other various layers of undercoat layer, overcoat layer, back coat layer may be formed on the substrate. For the back coat layer, preferred is a coating layer of an organic polymer compound as in JP-A 5-45885 or a metal oxide formed through hydrolysis and polycondensation an organic or inorganic metal compound as in JP-A 6-35174. For the coating layer, especially preferred are silicon alkoxide compounds such as $Si(OCH_3)_4$, $Si(OC_2H_5)_4$, $Si(OC_3H_7)_4$, $Si(OC_4H_9)_4$, as they are inexpensive and easily available and the coating layer of the metal oxide given by them have excellent resistance to development.

The substrate of the lithographic printing plate precursor may be any one having the necessary properties of strength, durability and flexibility.

For the substrate, for example, usable are metal plates such as aluminium, zinc, copper, stainless, iron; plastic films such as polyethylene terephthalate, polycarbonate, polyvinyl acetal, polyethylene; paper coated with synthetic resin or synthetic resin solution; composite materials formed according to a technique of deposing a metal layer on a plastic film through vacuum evaporation or lamination; and any other material generally used for substrates for printing plates. Of those, especially preferred are aluminium, and aluminium-coated composite substrates.

Preferably, the surface of the aluminium substrate is subjected to surface treatment for improving the adhesiveness thereof to an image-forming layer to be formed thereon. The surface treatment may be, for example, surface-roughening treatment of brush-polishing, ball-polishing, electrolytic etching, chemical etching, liquid-honing, sand-blasting; or their combination. Of those, especially preferred is surface-roughening treatment that includes electrolytic etching.

For the electrolytic bath for electrolytic etching, usable is an aqueous solution containing an acid, an alkali or their salt, or an aqueous solution containing an organic solvent. Of those, especially preferred is an electrolytic solution containing hydrochloric acid, nitric acid or their salts.

If desired, the aluminium substrate is, after being subjected to the surface-roughening treatment, desmutted with an aqueous solution of an acid or an alkali. Thus obtained, the aluminium substrate is preferably subjected to anodizing treatment. Especially preferably, it is processed in a bath that contains sulfuric acid or phosphoric acid for the anodizing treatment.

After the surface-roughening treatment (graining) and the anodizing treatment, it is also desirable to hydrophilicate the aluminium substrate. For the hydrophilication, for example, the aluminium substrate may be dipped in hot water or in a hot aqueous solution containing an inorganic salt or an organic salt; or it may be subjected to treatment for sealing of anodic oxide film in a steam bath; or it may be subjected to silicate treatment (with sodium silicate, potassium silicate), potassium fluorozirconate treatment, phosphomolybdate treatment, alkyl titanate treatment, polyacrylic acid treatment, polyvinylsulfonic acid treatment, polyvinylphosphonic acid treatment, phytic acid treatment, treatment with a salt of a hydrophilic organic polymer compound and a divalent metal, hydrophilication treatment by undercoating with a sulfonic acid group-containing water-soluble polymer, coloration with an acidic dye, or treatment for silicate electrodeposition.

In the manner as above, the lithographic printing plate precursor to be subjected to the development treatment of the invention may be fabricated.

<Exposure to Light>

Depending on the properties of the image-forming layer thereof, the lithographic printing plate precursor to be processed in the invention is imagewise exposed to light before its development. Concretely, the method for exposure to light comprises irradiation with light from IR laser or UV lamp or with visible light; irradiation with electron beam such as γ ray; or thermal energy impartation by the use of a thermal head, a heat roll, a non-contact heater or a heating zone with hot air. In particular, the lithographic printing plate precursor to be processed in the invention may be used as a computer-to-plate (CTP) printing plate on which an image may be directly written, based on the digital image information from a computer, by the use of a laser.

Most preferably, the light source for exposure to light of the lithographic printing plate precursor to be processed in the invention is a high-output laser having a maximum intensity within a range from the near IR to the IR region. The high-output laser of the type having a maximum intensity within a range from the near IR to the IR region includes, for example, various lasers having a maximum intensity within a range from the near IR to the IR region of from 760 nm to 3000 nm, such as semiconductor lasers, YAG lasers.

<Post-Treatment>

After being developed, the lithographic printing plate precursor is, if desired, washed with water and/or subjected to treatment with an aqueous desensitizing agent in the above-mentioned post-treatment tank. The aqueous desensitizing agent may be, for example, an aqueous solution of a water-soluble natural polymer such as arabic gum, dextrin, carboxymethyl cellulose; or a water-soluble synthetic polymer such as polyvinyl alcohol, polyvinylpyrrolidone, polyacrylic acid. If desired, acid or surfactant may be added to the aqueous desensitizing agent. After being treated with such a desensitizing agent, the lithographic printing plate is dried and used in printing.

After being developed, the printing plate precursor may be heated whereby a stronger image may be formed. Preferably, the heat treatment is effected generally within a temperature range of from 70° C. to 300° C., and the heating time is, though determined depending on the heating temperature, preferably from 10 seconds to 30 minutes or so.

EXAMPLES

The invention will be described in more detail with reference to the following Examples, which, however, are not intended to restrict the scope of the invention.

[Production of Graft Copolymer 1]

A mixture of 54 g of n-propanol and 16 g of deionized water was introduced into a 250-ml flask and heated to 70° C. with stirring, and the atmosphere inside the flask was purged with nitrogen.

A mixture of 54 g of n-propanol, 16 g of deionized water, 10 g of polyethylene glycol methyl ether methacrylate (50% aqueous solution, mean Mn=2080 (calculated), by Aldrich), 4.5 g of styrene, 40.5 g of acrylonitrile and 0.32 g of azobisisobutyronitrile (Vazo-64, by DuPont) was prepared in a different beaker, and dropwise added to the above flask over 30 minutes. After about 2.5 hours, 0.16 g of azobisisobutyronitrile was added to the reaction mixture. The polymerization was continued for further 2 hours. A polymer (graft copolymer 1) was obtained as a solution having a solid content of 21%.

[Production of Graft Copolymer 2]

384.1 g of 2-butanone and 4.25 g of polyethylene glycol methyl ether methacrylate (50% aqueous solution, Mw=2000, by Aldrich) was introduced into a 1-liter four-neck flask in a nitrogen atmosphere, and heated at 80° C. A pre-mixture of 38.0 g of allyl methacrylate and 0.3 g of azobisisobutyronitrile (Vazo-64, by DuPont) was added to it at 80° C. over 90 minutes. After the addition, 0.13 g of azobisisobutyronitrile (Vazo-64, by DuPont) was further added to it. Next, 0.13 g of azobisisobutyronitrile (Vazo-64, by DuPont) was added two times to it. The polymerization conversion based on the nonvolatile content was 90%.

[Fabrication of Lithographic Printing Plate Precursor]

To an aluminium substrate which had been electrolytically polished and processed for anodizing treatment with sulfuric acid and which had been post-treated with a VPA/PEGMA copolymer, applied was a photosensitive liquid having a composition of Table 1 shown below using a wire rod. This was dried at 100° C. for 90 seconds to fabricate a lithographic printing plate precursor with a photosensitive layer having a dry weight of 1.5 g/m$^2$.

TABLE 1

| Composition | wt. % |
|---|---|
| Urethane acrylate[1] | 2.48 |
| Graft copolymer[2] | 13.53 |
| Graft copolymer[3] | 3.97 |
| Irgacure 250[4] | 0.42 |
| IR absorbing dye A[5] | 0.13 |
| Mercapto-3-triazole[6] | 0.18 |
| Byk 336[7] | 0.60 |
| Klucel M[8] | 3.31 |
| N-propanol | 61.97 |
| water | 13.41 |

[1] Urethane acrylate: 80 wt. % 2-butanone solution prepared by reaction of DESMODUR N100 (hexamethylene diisocyanate-type aliphatic polyisocyanate resin, by Bayer) with hydroxyethyl acylate and pentaerythritol acrylate.

[2] Graft copolymer: 21% dispersion in n-propanol/water (80/20).

[3] Graft copolymer: 10 wt. % 2-butanone solution.

[4] Irgacure 250: 75% propylene carbonate solution of diphenyliodonium derivative (4-methoxyphenyl[4-(2-methylpropyl)phenyl]iodonium) hexafluorophosphate (by Ciba-Geigy).

[5] IR absorbing dye A: IR absorbing dye having the following chemical structure (by Kodak):

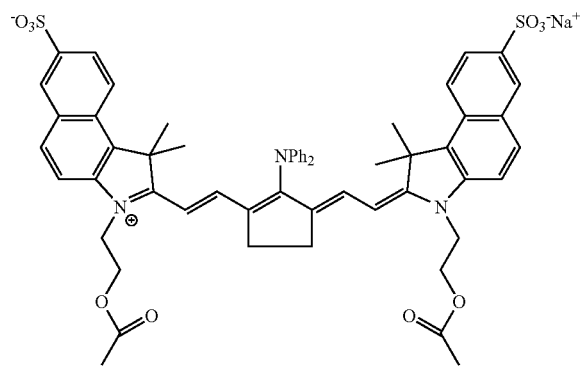

[6] Mercapto-3-triazole: 3-mercapto-1H,1,2,4-triazole (by PCAS).

[7] BYK-336: 25% xylene/methoxypropyl acetate solution of polyether-modified dimethylpolysiloxane copolymer (by Byk Chemie).

[8] Klucel M: hydroxypropyl cellulose (by Hercules) used as 2% aqueous solution.

EXAMPLE 1

Using Trendsetter 3244 (by Creo), the above lithographic printing plate precursor was exposed to light under a condition of 10 W and 90 rpm (corresponding to 250 mJ/cm$^2$).

Next, the exposed plate precursor was processed in Sonifier 450D (frequency 20 kHz, maximum 400 W, by Branson) with an ultrasonic generator fitted in the water therein. The plate precursor was dipped in water in the device for 30 seconds.

The dial of the output controller was set at a minimum 1 (its maximum is 10). In this stage, the output intensity was 50%, and the actual output from the ultrasonic generator was 25 W. After thus being processed with ultrasonic waves, the plate precursor was washed with water.

EXAMPLE 2

Using Trendsetter 3244 (by Creo), the above lithographic printing plate precursor was exposed to light under a condition of 10 W and 90 rpm (corresponding to 250 mJ/cm$^2$).

Next, the exposed plate precursor was processed in Sonifier 450D (frequency 20 kHz, maximum 400 W, by Branson) with an ultrasonic generator fitted in water therein. The plate precursor was dipped in water in the device for 30 second.

The dial of the output controller was set at 4 (its maximum is 10). In this stage, the output intensity was 40%, and the actual output from the ultrasonic generator was 65 W. After thus being processed with ultrasonic waves, the plate precursor was washed with water.

EXAMPLE 3

Using Trendsetter 3244 (by Creo), the above lithographic printing plate precursor was exposed to light under a condition of 10 W and 90 rpm (corresponding to 250 mJ/cm$^2$).

Next, the exposed plate precursor was processed in Sonifier 450D (frequency 20 kHz, maximum 400 W, by Branson) with an ultrasonic generator fitted in water therein. The plate precursor was dipped in water in the device for 30 second.

The dial of the output controller was set at 4 (its maximum is 10). In this stage, the output intensity was 40%, and the actual output from the ultrasonic generator was 65 W. After thus being processed with ultrasonic waves, the plate precursor was processed with an automatic processor PK-910 (by KPG). The development tank of the automatic processor PK-910 was filled with water. After being led through the development tank, the plate precursor was collected and not introduced into first and second rinsing tanks.

EXAMPLE 4

Using Trendsetter 3244 (by Creo), the above lithographic printing plate precursor was exposed to light under a condition of 10 W and 90 rpm (corresponding to 250 mJ/cm$^2$).

Next, the printing plate precursor 1 was processed in an electrolytic device (FIG. 1) with a constant-voltage constant-current device model, 5222B (maximum 18 V, 4.5 A, by Metrics) connected thereto, for 30 seconds. The applied voltage and current were 18 V and 0.5 A, respectively. As in FIG. 1, the lithographic printing plate precursor was connected to the cathode and dipped in 2.5 g/liter (NaCl/water) salt solution. The photosensitive layer of the plate precursor was positioned to face the anode. After thus being processed, the plate precursor was washed with water.

EXAMPLE 5

Using Trendsetter 3244 (by Creo), the above lithographic printing plate precursor was exposed to light under a condition of 10 W and 90 rpm (corresponding to 250 mJ/cm$^2$).

Next, the exposed plate precursor was processed in an electrolytic device (FIG. 1) with a constant-voltage constant-current device model, 5222B (maximum 18 V, 4.5 A, by Metrics) connected thereto, for 30 seconds. The applied voltage and current were 18 V and 0.5 A, respectively. As in FIG. 1, the lithographic printing plate precursor was connected to the cathode and dipped in 2.5 g/liter (NaCl/water) salt solution. The photosensitive layer of the plate precursor was positioned to face the anode. After thus being processed, the plate precursor was washed with water. Next, the plate precursor was processed with an automatic processor PK-910 (by KPG). The development tank of the automatic processor PK-910 was filled with water. After being led through the development tank, the plate precursor was collected and not introduced into first and second rinsing tanks.

EXAMPLE 6

Using Trendsetter 3244 (by Creo), the above lithographic printing plate precursor was exposed to light under a condition of 10 W and 90 rpm (corresponding to 250 mJ/cm$^2$).

Next, the printing plate precursor 1 was processed in an electrolytic device (FIG. 2) with a constant-voltage constant-current device model, 5222B (maximum 18 V, 4.5 A, by Metrics) connected thereto, for 30 seconds. The applied voltage and current were 18 V and 0.5 A, respectively. As in FIG. 2, the lithographic printing plate precursor was connected to the anode and dipped in 2.5 g/liter (NaCl/water) salt solution. The photosensitive layer of the plate precursor was positioned to face the cathode. After thus being processed, the plate precursor was washed with water.

EXAMPLE 7

Using Trendsetter 3244 (by Creo), the above lithographic printing plate precursor was exposed to light under a condition of 10 W and 90 rpm (corresponding to 250 mJ/cm$^2$).

Next, the plate precursor was processed in an electrolytic device (FIG. 2) with a constant-voltage constant-current device model, 5222B (maximum 18 V, 4.5 A, by Metrics) connected thereto, for 30 seconds. The applied voltage and current were 18 V and 0.5 A, respectively. As in FIG. 2, the lithographic printing plate precursor was connected to the anode and dipped in 2.5 g/liter (NaCl/water) salt solution. The photosensitive layer of the plate precursor was positioned to face the cathode. After thus being processed, the plate precursor was washed with water. Next, the plate precursor was processed with an automatic processor PK-910 (by KPG). The development tank of the automatic processor PK-910 was filled with water. After being led through the development tank, the plate precursor was collected and not introduced into first and second rinsing tanks.

EXAMPLE 8

Using Trendsetter 3244 (by Creo), the above lithographic printing plate precursor was exposed to light under a condition of 10 W and 90 rpm (corresponding to 250 mJ/cm$^2$).

Next, the plate precursor was processed in an electrolytic device (FIG. 3) with a constant-voltage constant-current device model, 5222B (maximum 18 V, 4.5 A, by Metrics) connected thereto, for 30 seconds. The applied voltage and current were 18 V and 0.5 A, respectively. As in FIG. 3, the lithographic printing plate precursor was set near to the cathode but not in contact with it, and was dipped in a 2.5 g/liter (NaCl/water) salt solution. The photosensitive layer of the plate precursor was positioned to face the anode. After thus being processed, the plate precursor was washed with water.

EXAMPLE 9

Using Trendsetter 3244 (by Creo), the above lithographic printing plate precursor was exposed to light under a condition of 10 W and 90 rpm (corresponding to 250 mJ/cm$^2$).

Next, the plate precursor was processed in an electrolytic device (FIG. 3) with a constant-voltage constant-current device model, 5222B (maximum 18 V, 4.5 A, by Metrics) connected thereto, for 30 seconds. The applied voltage and current were 18 V and 0.5 A, respectively. As in FIG. 3, the lithographic printing plate precursor was set near to the cathode but not in contact with it, and dipped in a 2.5 g/liter (NaCl/water) salt solution. The photosensitive layer of the plate precursor was positioned to face the anode. After thus being processed, the plate precursor was washed with water. Next, the plate precursor was processed with an automatic processor PK-910 (by KPG). The development tank of the automatic processor PK-910 was filled with water. After led through the development tank, the plate precursor was collected and not introduced into first and second rinsing tanks.

EXAMPLE 10

Using Trendsetter 3244 (by Creo), the above lithographic printing plate precursor was exposed to light under a condition of 10 W and 90 rpm (corresponding to 250 mJ/cm$^2$).

Next, the plate precursor was processed in an electrolytic device (FIG. 4) with a constant-voltage constant-current device model, 5222B (maximum 18 V, 4.5 A, by Metrics) connected thereto, for 30 seconds. The applied voltage and current were 18 V and 0.5 A, respectively. As in FIG. 4, the lithographic printing plate precursor was set near to the anode but not in contact with it, and dipped in a 2.5 g/liter (NaCl/water) salt solution. The photosensitive layer of the plate precursor was positioned to face the cathode. After thus being processed, the plate precursor was washed with water.

EXAMPLE 11

Using Trendsetter 3244 (by Creo), the above lithographic printing plate precursor was exposed to light under a condition of 10 W and 90 rpm (corresponding to 250 mJ/cm$^2$).

Next, the plate precursor was processed in an electrolytic device (FIG. 4) with a constant-voltage constant-current device model, 5222B (maximum 18 V, 4.5 A, by Metrics) connected thereto, for 30 seconds. The applied voltage and current were 18 V and 0.5 A, respectively. As in FIG. 4, the lithographic printing plate precursor was set near to the anode but not in contact with it, and dipped in a 2.5 g/liter (NaCl/water) salt solution. The photosensitive layer of the plate precursor was positioned to face the cathode. After thus being processed, the plate precursor was washed with water. Next, the plate precursor was processed with an automatic processor PK-910 (by KPG). The development tank of the automatic processor PK-910 was filled with water. After being led through the development tank, the plate precursor was collected and not introduced into first and second rinsing tanks.

COMPARATIVE EXAMPLE 1

Using Trendsetter 3244 (by Creo), the above lithographic printing plate precursor was exposed to light under a condition of 10 W and 90 rpm (corresponding to 250 mJ/cm$^2$). The exposed plate precursor was dipped in 2.5 g/liter (NaCl/water) salt solution for 30 seconds. Next, this was washed with water.

COMPARATIVE EXAMPLE 2

Using Trendsetter 3244 (by Creo), the above lithographic printing plate precursor was exposed to light under a condition of 10 W and 90 rpm (corresponding to 250 mJ/cm$^2$). The exposed plate precursor was dipped in 2.5 g/liter (NaCl/water) salt solution for 30 seconds. Next, this was washed with water. After this, the plate precursor was processed with an automatic processor PK-910 (by KPG). The development tank of the automatic processor PK-910 was filled with water. After led through the development tank, the plate precursor was collected and not introduced into first and second rinsing tanks.

After being washed or after being developed, the surface condition of the printing plates of Examples 1 to 11 and Comparative Examples 1 and 2 was visually observed and evaluated. The results are shown in Table 2.

TABLE 2

| | Mode of Treatment | Condition | Surface Condition after washed | Surface Condition after developed |
|---|---|---|---|---|
| Example 1 | ultrasonic waves | 25 W | C | — |
| Example 2 | ultrasonic waves | 65 W | B | — |
| Example 3 | ultrasonic waves | 65 W | — | B |
| Example 4 | current application | connected to cathode | B | — |
| Example 5 | current application | connected to cathode | — | A |
| Example 6 | current application | connected to anode | D/E scu | — |
| Example 7 | current application | connected to anode | — | B scu |
| Example 8 | current application | positioned near to cathode | D/E scu | — |
| Example 9 | current application | positioned near to cathode | — | B scu |
| Example 10 | current application | positioned near to anode | A/B | — |
| Example 11 | current application | positioned near to anode | — | A |
| Comparative Example 1 | no | — | D/E | — |
| Comparative Example 2 | no | — | — | C |

Remarks:
A: The non-image area was clear.
B: A part of the non-image area was not clear.
C: A half of the non-image area was not clear.
D: Almost no change was found.
E: No change was found.
scu: Development scum formed.

From these results, it is understood that ultrasonic waves and current application (in particular when the lithographic printing plate precursor was connected to the cathode) assist the development with no problem. It is unnecessary to connect the lithographic printing plate precursor to be processed to electrode, and the plate precursor may be positioned near to an electrode (in particular when the lithographic printing plate precursor is positioned near to anode) for a substantial current application treatment thereof.

EXAMPLE 12

Using Trendsetter 3244 (by Creo), the above lithographic printing plate precursor was exposed to light under a condition of 10 W and 90 rpm (corresponding to 250 mJ/cm$^2$).

Next, the exposed plate precursor was processed in an automatic processor PK-910 (by KPG) with an ultrasonic generator, Sonifier 450D (frequency 20 kHz, maximum 400 W, by Branson), fitted thereto. The development tank was filled with water, and the development time was 30 seconds. The dial of the output controller was set at a minimum 1. In this stage, the output intensity was 50%, and the output from the ultrasonic generator was 25 W. Some cavitation noise was heard.

EXAMPLE 13

Using Trendsetter 3244 (by Creo), the above lithographic printing plate precursor was exposed to light under a condition of 10 W and 90 rpm (corresponding to 250 mJ/cm$^2$).

Next, the exposed plate precursor was processed in an automatic processor PK-910 (by KPG) with an ultrasonic generator, Sonifier 450D (frequency 20 kHz, maximum 400 W, by Branson), fitted thereto. The development tank was filled with water, and the development time was 30 seconds. The dial of the output controller was set at 4. In this stage, the output intensity was 40%, and the output from the ultrasonic generator was 65 W. Much cavitation noise was heard.

EXAMPLE 14

Using Trendsetter 3244 (by Creo), the above lithographic printing plate precursor was exposed to light under a condition of 10 W and 90 rpm (corresponding to 250 mJ/cm$^2$).

Next, the plate was processed in an automatic processor PK-910 (by KPG) having a grounded electroconductive brush and a floating lid fitted to the development tank thereof. The cathode of a constant-voltage constant-current device model, 5222B (maximum 18 V, 4.5 A, by Metrics) was connected to the electroconductive brush, and the anode thereof to the floating lid. The voltage and the current were 18 V and 0.5 A, respectively. For lowering the electric resistance therein, the development tank was filled with water with 56.25 g (2.5 g/liter) of salt added thereto. The development time was 30 seconds. During development, bubbles were found and formed on the surface of the plate precursor.

EXAMPLE 15

Using Trendsetter 3244 (by Creo), the above lithographic printing plate precursor was exposed to light under a condition of 10 W and 90 rpm (corresponding to 250 mJ/cm$^2$).

Next, the plate was processed in an automatic processor PK-910 (by KPG) having a grounded electroconductive brush and a floating lid fitted to the development tank thereof. The anode of a constant-voltage constant-current device model, 5222B (maximum 18 V, 4.5 A, by Metrics) was connected to the electroconductive brush, and the cathode thereof to the floating lid. The voltage and the current were 18 V and 0.5 A, respectively. For lowering the electric resistance therein, the development tank was filled with water with 56.25 g (2.5 g/liter) of salt added thereto. The development time was 30 seconds. During development, bubbles were found and formed on the floating lid electrode.

EXAMPLE 16

Using Trendsetter 3244 (by Creo), the above lithographic printing plate precursor was exposed to light under a condition of 10 W and 90 rpm (corresponding to 250 mJ/cm$^2$).

Next, the plate was processed in an automatic processor PK-910 (by KPG) having a floating lid fitted to the development tank thereof. The cathode of a constant-voltage constant-current device model, 5222B (maximum 18 V, 4.5 A, by Metrics) was connected to the bottom of the development tank, and the anode thereof to the floating lid. The voltage and the current were 18 V and 0.5 A, respectively. For lowering the electric resistance therein, the development tank was filled with water with 56.25 g (2.5 g/liter) of salt added thereto. The development time was 30 seconds. During development, bubbles were found and formed on the floating lid electrode.

EXAMPLE 17

Using Trendsetter 3244 (by Creo), the above lithographic printing plate precursor was exposed to light under a condition of 10 W and 90 rpm (corresponding to 250 mJ/cm$^2$).

Next, the plate was processed in an automatic processor PK-910 (by KPG) having a floating lid fitted to the development tank thereof. The anode of a constant-voltage constant-current device model, 5222B (maximum 18 V, 4.5 A, by Metrics) was connected to the bottom of the development tank, and the cathode thereof to the floating lid. The voltage and the current were 18 V and 0.5 A, respectively. For lowering the electric resistance therein, the development tank was filled with water with 56.25 g (2.5 g/liter) of salt added thereto. The development time was 30 seconds. During development, bubbles were found and formed on the development tank bottom electrode and from the surface of the plate precursor.

COMPARATIVE EXAMPLE 3

Using Trendsetter 3244 (by Creo), the above lithographic printing plate precursor was exposed to light under a condition of 10 W and 90 rpm (corresponding to 250 mJ/cm$^2$).

This the plate processed with an automatic processor PK-910 (by KPG). The development time was 30 seconds.

The developed condition of the printing plates obtained in Examples 12 to 17 and Comparative Example 3 was visually confirmed. The results are given in Table 3.

TABLE 3

| | Mode of Treatment + Means of Development | Condition | Surface Condition after development |
|---|---|---|---|
| Example 12 | ultrasonic waves + morton roller | 25 W | B/C |
| Example 13 | ultrasonic waves + morton roller | 65 W | B |
| Example 14 | current application + morton roller | cathode – electroconductive brush anode – floating lid | A |
| Example 15 | current application + morton roller | cathode – floating lid anode – bottom of development tank | B scu |
| Example 16 | current application + morton roller | cathode – floating lid anode – electroconductive brush | B scu |
| Example 17 | current application + morton roller | cathode – bottom of development tank anode – floating lid | A |
| Comparative Example 3 | morton roller alone | | D |

Remarks:
A: Completely developed.
B: A little development failure found.
C: Development failure found in places. morton roller trace also found.
D: Development finished partially. morton roller trace noticeably found.
scu: Development scum formed.

From the experimental results, it is understood that the combination of development with ultrasonic treatment or current treatment enables water development, that was heretofore difficult, by morton roller rubbing alone.

[Printing Test]

The printing plates obtained through water development in Examples 12 to 15 and Comparative Example 3 were tested for printing. The plates with development failure were rubbed with a wetted cloth waste to remove the photosensitive layer.

Concretely, using Dainippon Ink's Values G magenta N grade for printing ink, Dainippon Ink's NA-108W 1% and IPA 1% for damping water, and 44.5 kg of Oji Paper Manufacturing's coated paper, and using Roland's R-200 printer, 30000 sheets were printed with the printing plate and the printability of the printing plate was evaluated. The printing durability of the printing plate was judged by visually observing the outward appearance of the photosensitive layer of the printing plate after it was used for printing 30000 sheets. Regarding the ink staining resistance of the printing plate, the non-image area of the printed sheets was checked for ink stains after the start of the printing. The results are given in Table 4.

TABLE 4

| | Printing Durability | Ink Staining Resistance | Evaluation with developability in consideration |
|---|---|---|---|
| Example 12 | OK | OK | good |
| Example 13 | OK | OK | good |
| Example 14 | OK | OK | excellent |
| Example 17 | OK | OK | excellent |
| Comparative Example 3 | OK | OK | poor |

From the experimental results, it can be understood that the combination of development with ultrasonic treatment or current treatment enables water development, that was heretofore difficult, by morton roller rubbing alone, and it has no negative influence on the printing properties of the processed printing plates.

Figure 1:
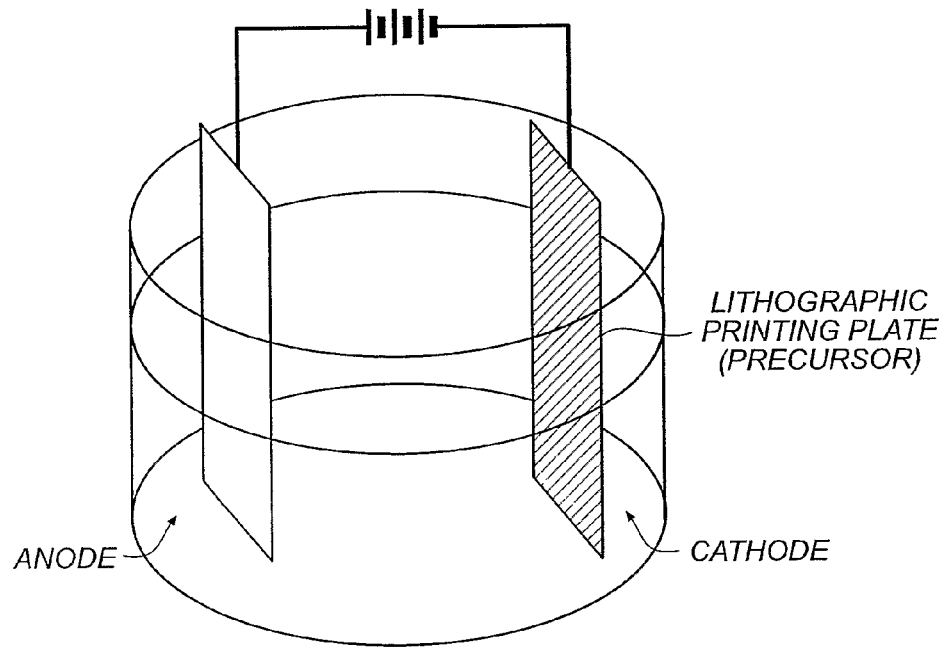
FIG. 1 A conceptual view showing the outline of electrification treatment for lithographic printing plate precursors in Examples 4 and 5.
Figure 2:
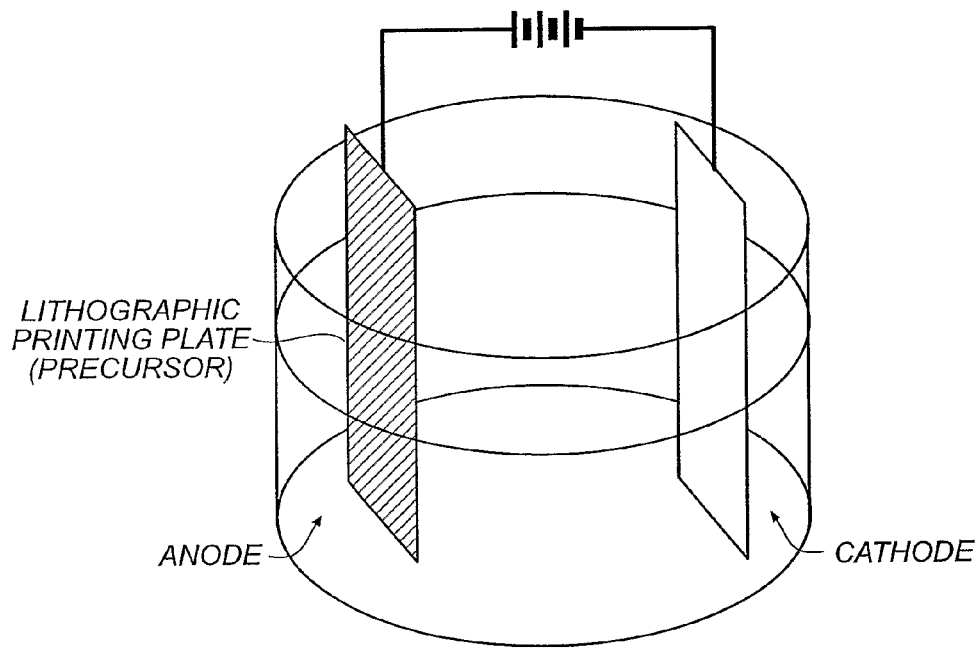
FIG. 2 A conceptual view showing the outline of electrification treatment for lithographic printing plate precursors in Examples 6 and 7.
Figure 3:
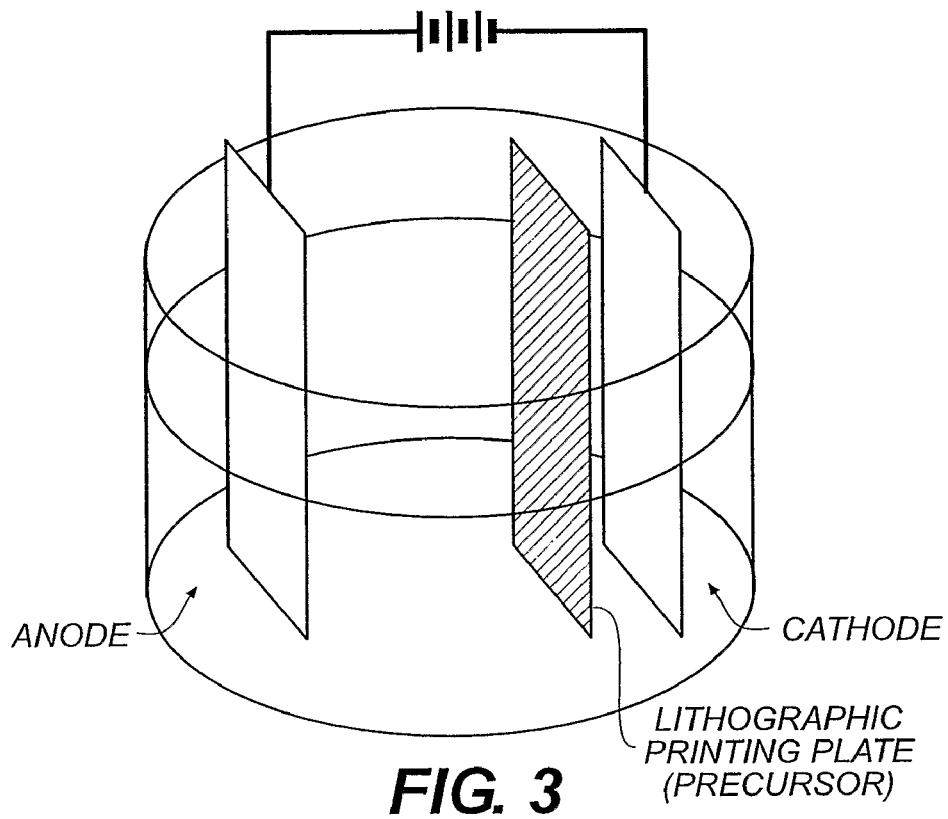
FIG. 3 A conceptual view showing the outline of electrification treatment for lithographic printing plate precursors in Examples 8 and 9.
Figure 4:
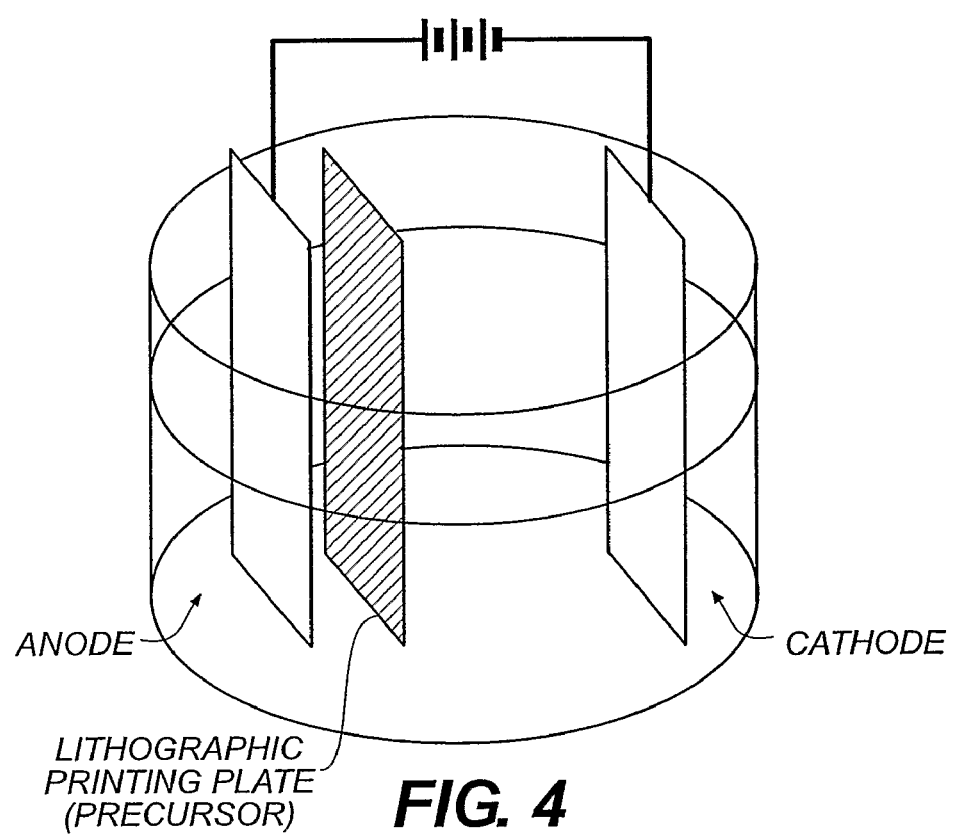
FIG. 4 A conceptual view showing the outline of electrification treatment for lithographic printing plate precursors in Examples 10 and 11.

The invention claimed is:

1. A method for developing a lithographic printing plate precursor that comprises an image-forming layer comprising an unsaturated double-bond containing substance, a graft polymer that has a poly(alkyleneoxide) unit in the side branch thereof, and a photothermal conversion substance, said method comprising:
   developing said precursor with a neutral developer having a pH of from 5.8 to 8.6 in combination with a means for removing non-imaged parts of said lithographic printing plate precursor, while said neutral developer is subjected to ultrasonic waves at a frequency of from 10 to 100 kHz and an output of from 10 to 400 W,
   wherein the removing means is a brush roller, morton roller, or developer-jetting nozzle.

2. The method of claim 1, further comprising:
   treating said lithographic printing plate precursor in a pretreatment step before developing with a neutral pretreatment liquid having a pH of from 5.8 to 8.6, wherein said neutral pretreatment liquid is subjected to ultrasonic waves, an electric current, or to both.

3. The method of claim 2 wherein both said developer and neutral pretreatment liquid are subjected to ultrasonic waves or to both ultrasonic waves and an electric current.

4. The method of claim 1 wherein image formation in said precursor is accomplished by thermal crosslinking reaction of the unsaturated double bond-containing substance.

5. The method of claim 1 wherein said developer has a pH of from 6 to 8.

6. The method of claim 1 wherein said developer contains an organic solvent in an amount of from 0.1 to 5% based on the total weight of said developer.

7. The method of claim 1 wherein said developer contains a surfactant in an amount of from 0.001 to 5% based on total weight of the developer.

8. The method of claim 2 such that when said neutral pretreatment liquid is subjected to an electric current, an electrolyte is added to said neutral pretreatment liquid in an amount of from 0.01 to 5% based on the mass of the neutral pretreatment liquid, and the electric current is direct current at a voltage of from 1 to 100V and current of from 0.1 to 10 A.

9. The method of claim 1 wherein said lithographic printing plate precursor comprises an overcoat layer over said image-forming layer.

10. The method of claim 1 wherein said developing is carried out on a printer.

11. An apparatus for developing the lithographic printing plate precursor of claim 1, which comprises:
   a development tank containing a neutral developer having a pH of from 5.8 to 8.6 for application to a lithographic printing plate precursor,
   a development-promoting means for imparting ultrasonic waves to said neutral developer at a frequency of from 10 to 100 kHz and an output of from 10 to 400 W, and
   a removing means for removing non-imaged parts of said lithographic printing plate precursor that is a brush roller, a morton roller, or a developer-jetting nozzle.

12. The apparatus of claim 11 further comprising a pretreatment tank for applying a neutral pretreatment liquid having a pH of from 5.8 to 8.6 to the lithographic printing plate precursor before development, and
   wherein said development-promoting unit is designed for imparting ultrasonic waves or an electric current to said neutral pretreatment liquid.

13. The method of claim 1 wherein said removing means is a brush roller or a morton roller.

* * * * *